United States Patent [19]
Drehman

[11] Patent Number: 5,936,401
[45] Date of Patent: Aug. 10, 1999

[54] DEVICE AND PROCESS FOR MEASURING ELECTRICAL PROPERTIES AT A PLURALITY OF LOCATIONS ON THIN FILM SUPERCONDUCTORS

[75] Inventor: Alvin Drehman, Chelmsford, Mass.

[73] Assignee: The United States of America as represented by the Secretary of the Air Force, Washington, D.C.

[21] Appl. No.: 08/725,200

[22] Filed: Sep. 19, 1996

[51] Int. Cl.$^6$ .......................... G01R 33/12; G01R 33/16; G01N 27/72; H01L 39/00

[52] U.S. Cl. .......................... 324/234; 324/201; 324/224; 324/232; 324/233; 505/726

[58] Field of Search ...................... 324/201, 222, 324/224, 232, 233, 234, 239; 505/726, 727, 843

[56] References Cited

U.S. PATENT DOCUMENTS

| | | | |
|---|---|---|---|
| 5,030,912 | 7/1991 | Herko et al. | 324/239 |
| 5,053,705 | 10/1991 | Herko | 324/240 |
| 5,086,274 | 2/1992 | Gobin et al. | 324/239 |
| 5,218,296 | 6/1993 | Shinde et al. | 324/239 |
| 5,280,240 | 1/1994 | Shaulov et al. | 324/239 |
| 5,283,524 | 2/1994 | Shaulov et al. | 324/239 |

*Primary Examiner*—Jay Patidar
*Attorney, Agent, or Firm*—Thomas C. Stover

[57] ABSTRACT

A device and process for determining the uniformity of a superconducting film's critical current density and transition temperature over a large area uses an array of ac coils placed in close proximity to a superconducting film. A variable ac current is passed through each coil which induces a proportional current in the superconducting film. A lock-in amplifier set to the third harmonic of the ac current is put in parallel with the ac current source. When the current in the film exceeds the critical density of the film then the third harmonic is picked up by the lock-in amplifier. In this way one can measure the critical current density of the film at each of the coils. The above coils are mounted within a flat plate (the film side of the substrate is placed against the plate). The entire assembly is cooled within a cryostat so that the temperature can be precisely controlled. This is necessary so that the critical current can be measured as a function of temperature as it varies greatly near the transition temperature and this is the range of interest.

8 Claims, 1 Drawing Sheet

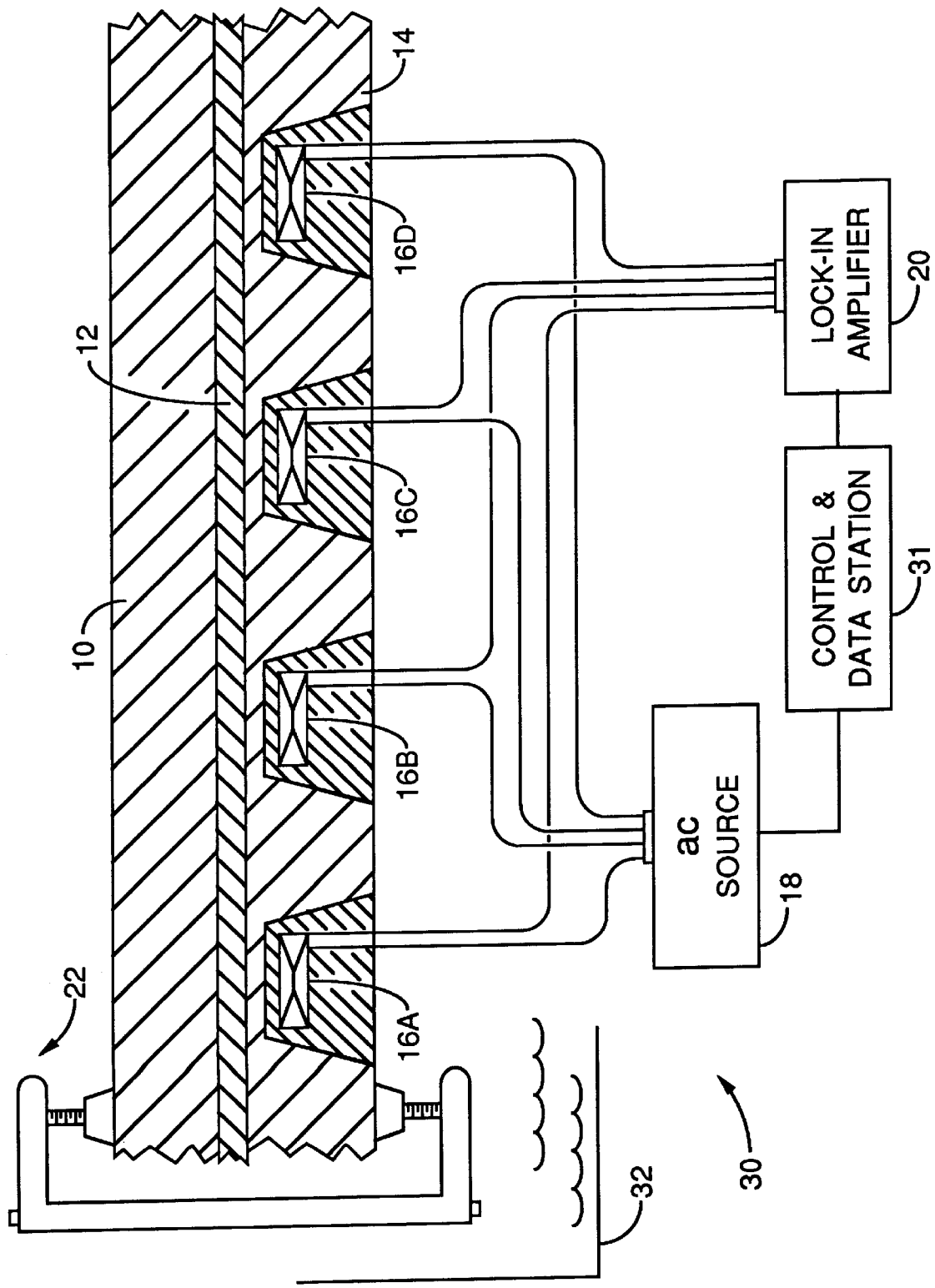

DEVICE AND PROCESS FOR MEASURING ELECTRICAL PROPERTIES AT A PLURALITY OF LOCATIONS ON THIN FILM SUPERCONDUCTORS

STATEMENT OF GOVERNMENT INTEREST

The invention described herein may be manufactured and used by or for the Government for governmental purposes without the payment of any royalty thereon.

BACKGROUND OF THE INVENTION

The present invention relates to examining the uniformity of properties of a superconducting thin film, and in particular, to non-destructively measuring the local critical current density of the film as a function of temperature and location.

There is no simple, nondestructive, method currently available that can measure the uniformity of the electrical properties of a superconducting thin film over a large area. In particular, for microwave applications, one needs to have an extremely low surface impedance over the entire useful area of the film. Direct measurement of the surface impedance requires a fairly large area, typically several centimeters in diameter, and therefore is of limited use for determining uniformity. On the other hand, one typically finds that a low surface impedance, at microwave frequencies, correlates with a high critical current density. The critical current density can be measured at a low frequency. Therefore one can use a device for measuring the uniformity of the critical current density as a way of measuring the uniformity of the surface impedance.

Other techniques give a single value to such quantities as the surface impedance (by measuring the Q of a cavity which utilizes the superconducting film as one end wall), or the surface impedance of a stripline. The first technique is an average over a large area, while the second requires the film to be patterned and is thus destructive.

One technique for determining the critical current density of a small section of a superconducting film is to put a small (1 to 4 mm diameter) coil in close proximity to the film. Passing an ac. current through the coil induces an ac. current in the film. By measuring the third harmonic response as a function of the coil's current one can determine the critical current of the film (see "A contactless method for measurement of the critical current density and critical temperature of superconducting film" J. H. Classen, M. E. Reeves, and R. J. Soulen, Jr., Rev. Sci Inst. vol. 62, pp. 996–1004, 1991). This works because the current induced in the film is proportional to the current in the coil and because a third harmonic signal occurs when the film leaves the superconducting state due to the induced current exceeding its critical current carrying ability. Thus, one can, after calibration, make a direct measurement of the critical current density.

The need for determining film quality and uniformity of superconducting films is important in developing phased array superconducting microwave antenna.

It is believed that there is no process for measuring the uniformity of the electrical properties of a superconducting thin film in such a way as to avoid destroying the film. Thus, there exists a need for the development of the present invention which is able to examine the uniformity of the electrical properties of a superconducting thin film without harming said film.

SUMMARY OF THE INVENTION

The critical current density of a small section of a superconducting film is determined by putting a small (1 to 4 mm diameter) coil in close proximity to the film. Passing an ac current through the coil induces an ac current in the film. A lock-in amplifier, set to the third harmonic of the ac current, is put in parallel with the ac current source. When the current in the film exceeds the critical current density of the film then a third harmonic is picked up by the lock-in amplifier. An array of such coils is mounted within an insulating flat plate upon which the thin film is placed (the film side of the substrate against the plate). The array would contain 1 to 10 coils per square centimeter, depending on the scale of uniformity that is desired to be measured. The plate, and the coil array within it, would typically be several inches in diameter, but the size is not limited by the method.

The entire assembly is located within a cryostat so that the temperature can be precisely controlled. This is necessary so that the critical current can be measured as a function of temperature as it varies greatly near the transition temperature (as this is the range of greatest interest). It is also necessary to calibrate each of the coils, as the current in the film is proportional to the coil current, but the proportionality constant depends on the geometry and proximity of the coil to the film as well as number of turns in the coil.

Therefore, one object of the present invention is to provide a means for determining the overall quality and uniformity of properties of a superconducting thin film without destroying said superconducting thin film.

Another object of the present invention is to measure the local critical current density of the film as a function of temperature and location.

These and many other objects and advantages of the present invention will be readily apparent to one skilled in the pertinent art from the following detailed description of a preferred embodiment of the invention and the related drawings.

BRIEF DESCRIPTION OF THE DRAWINGS

The only FIGURE of the present invention depicts the relative geometry of the film and the inventive device with the detecting coils therein.

DESCRIPTION OF THE PREFERRED EMBODIMENT

Referring to the FIGURE, a device 30 for determining the quality and uniformity of large area superconducting film 12 is shown, partially. The device 30 is used to test a substrate 10 which acts as a surface for supporting a superconducting film 12 deposited thereon in a conventional manner. The device 30 consists of a coil plate 14 facing the side of said substrate 10 on which the superconducting film 12 has been deposited. In normal operation, the film 12 is placed in contact with the coil plate 14. The coil plate 14 contains a plurality of coils, 16A through 16D, with electrical leads. Each coil has a pair of electrical leads connected thereto in parallel with the leads to the other coils. Each pair of electrical leads connect each coil to an ac source 18 and, in parallel, to a lock-in amplifier 20. Also depicted in the FIGURE is a mechanical means 22 for holding the substrate 10 against the coil plate 14. The plate 14 is contained within a temperature controllable cryostat 32 only shown partially in the FIGURE.

The device 30 operates when the entire assembly is cooled to a temperature at which the measurements of the critical current density of the film 12 are to be made and when the ac source 18 provides a current to the coils 16A, 16B, 16C, 16D through the leads shown. Current is provided to each coil separately during the measurement. The current is ramped up in one coil until a change in the third harmonic signal is detected (a practical threshold level must be determined) by means of the lock-in amplifier 20. Using the predetermined calibration for this coil one obtains the critical current of that location of the film 12 at the measurement temperature. This is repeated for each of the coils at that particular temperatures and thus is collected a series of critical currents and temperatures for the coils. These measurements can also be done in parallel by having more than one lock-in amplifier and/or by multiplexing. The measurement at each coil should take only a few seconds. The control and recording of the data can be accomplished with the use of a device 31 connected to both the ac source 18 and the lock-in amplifier 20. This will give the critical current of the film at a position which corresponds to each coil location. After all of the coils have been measured (possibly several times each to increase precision of the measurement) the entire process is repeated at another temperature. By making the set of critical current measurements at several temperatures one can extrapolate the data to the temperature at which the critical density is zero and thereby determine the transition temperature at each location. Thus this device will provide the temperature dependent critical current and transition temperature of the film 12 as a function of location. From this data one gets a very good measure of the overall uniformity of the film 12.

The device 30 of the present invention provides a process which is non-destructive for determining the overall uniformity of the electrical properties of a large area superconducting film. Further, by the addition of a large coil one could add the ability to measure ac and/or dc susceptibility as a function of temperature. By the introduction of a small microwave field one could detect the presence of weak links in the vicinity of each coil. By the introduction of a large microwave field one may be able to measure the effect of microwave power in the vicinity of each coil. This is an important criterion for making superconducting antennas for transmission.

Clearly many modifications and variations of the present invention are possible in light of the above teachings and it is therefore understood, that within the inventive scope of the inventive concept, that the invention may be practiced otherwise than specifically claimed.

What is claimed is:

1. An apparatus for determining the quality and uniformity of large area superconducting(sc) films comprising,
   (a) an sc film mounted to a substrate,
   (b) a coil plate,
   (c) an array of coils mounted in said coil plate,
   (d) means to hold said sc film proximate said coil plate,
   (e) AC current inducing means to run an AC current separately through each of said coils in said coil plate,
   (f) a lock-in amplifier to detect a third harmonic signal, said amplifier being connected separately to said plurality of coils and parallel with said AC current inducing means,
   (g) means for varying the temperature of said substrate and thus of said sc film including cooling same as desired
   (h) means to measure at a desired film temperature the critical current of said sc film as indicated by said third harmonic signal, simultaneously at a plurality of coil locations proximate said film and
   means to repeat such measurements at a plurality of film temperatures so as to obtain a family of curves, one for each of a plurality of said coils, at a plurality of temperatures, by simultaneous reading of the coils to locate non-uniformities across said film.

2. A device as defined in claim 1 wherein said coil plate has approximately 1 to 10 coils per square centimeter.

3. A device as defined in claim 2 wherein each of said coils has a diameter of approximately 1 to 4 millimeters.

4. A process for non-destructively determining the overall uniformity of the electrical properties of a large area superconducting film, said process comprising the steps of:
   a) positioning the superconducting film supported by a substrate in close proximity to a coil plate, said coil plate having a plurality of coils therein;
   b) cooling said superconducting film and said coil plate to a selected temperature wherein said superconducting film is at or near a superconducting state;
   c) running an AC current selectively through each of said coils in close proximity to the superconducting film being analyzed;
   d) ramping up said current until a change is detected in the third harmonic signal of said AC current by means of a lock-in amplifier connected in parallel with an AC current source to determine the critical current at said temperature;
   e) obtaining simultaneously the critical current at film locations in close proximity to each of said coils or coil locations by means of a predetermined calibration of each of said coils; and
   f) repeating said above steps at another film temperature and means to repeat such measurements so as to obtain a family of curves related to critical current measurements in said film at said locations at a plurality of temperatures, one curve for each of a plurality of said coils by simultaneous reading of the coils to locate non-uniformities across said film.

5. A process as defined in claim 4 wherein said cooling is occurs by means of a cryostat.

6. A process as defined in claim 4 wherein data given by analysis at multiple temperatures allows for extrapolating the temperature at which the critical density of the film is zero and thereby determining the transition temperature at each location of the film.

7. A process as defined in claim 4 in which the current and transition temperature of the superconducting film is analyzed as a function of location thereby providing a measure of the overall uniformity of the film.

8. A process as defined in claim 4 in which said plurality of coils in the coil plate allow for efficient analysis of the whole superconducting film.

* * * * *